(12) United States Patent
Yariv

(10) Patent No.: US 6,934,425 B2
(45) Date of Patent: Aug. 23, 2005

(54) TRAVERSE BRAGG RESONANCE LASERS AND AMPLIFIERS AND METHOD OF OPERATING THE SAME

(75) Inventor: Amnon Yariv, Pasadena, CA (US)

(73) Assignee: Califoria Institute of Technology, Pasadena, CA (US)

( * ) Notice: Subject to any disclaimer, the term of this patent is extended or adjusted under 35 U.S.C. 154(b) by 0 days.

(21) Appl. No.: 10/763,541

(22) Filed: Jan. 23, 2004

(65) Prior Publication Data

US 2004/0213498 A1 Oct. 28, 2004

Related U.S. Application Data

(60) Provisional application No. 60/442,490, filed on Jan. 24, 2003.

(51) Int. Cl.[7] .............................. G02B 6/34; G02B 6/12; H01S 5/026; H01S 5/50
(52) U.S. Cl. ........................... 385/10; 385/37; 385/129; 372/44; 372/50; 359/344
(58) Field of Search ..................... 385/10, 37, 123–127, 385/129–132; 372/43–50, 92, 96; 359/342, 344, 346

(56) References Cited

U.S. PATENT DOCUMENTS 4,880,752 A * 11/1989 Keck et al. ................ 435/7.72
5,572,328 A * 11/1996 Fouckhardt et al. ........ 356/440
5,703,899 A * 12/1997 Mizutani ...................... 372/96
6,061,381 A *  5/2000 Adams et al. ................ 372/96
6,201,825 B1 *  3/2001 Sakurai et al. ............... 372/96

* cited by examiner

Primary Examiner—John D. Lee
(74) Attorney, Agent, or Firm—Daniel L. Dawes; Myers Dawes Andras & Sherman

(57) ABSTRACT

A transverse Bragg resonance waveguide is comprised of a waveguiding channel, and on at least two opposing sides of the channel two periodic index media; and a means for providing gain in the periodic index media. In one embodiment the waveguiding channel is planar and is sandwiched on two opposing sides by the periodic index media. In another embodiment the waveguiding channel is cylindrical and is surrounded by the periodic index media. The means for providing gain in the periodic index media is electrical or optical pumping. The periodic index media comprises a periodic lattice of regions having an index of refraction distinct from the channel, such as an array of transverse holes defined in a planar semiconductor substrate in which the channel is also defined, or an array of longitudinal holes defined in a cylindrical semiconductor fiber in which the channel is also longitudinally defined.

21 Claims, 6 Drawing Sheets

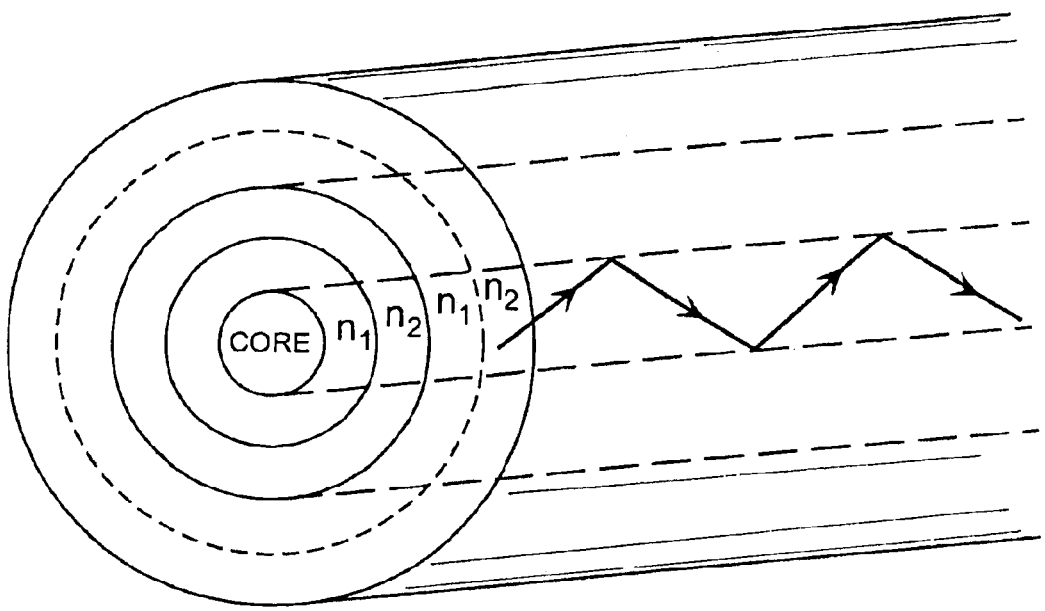
FIG. 4A
PRIOR ART
FIG. 4B
PRIOR ART
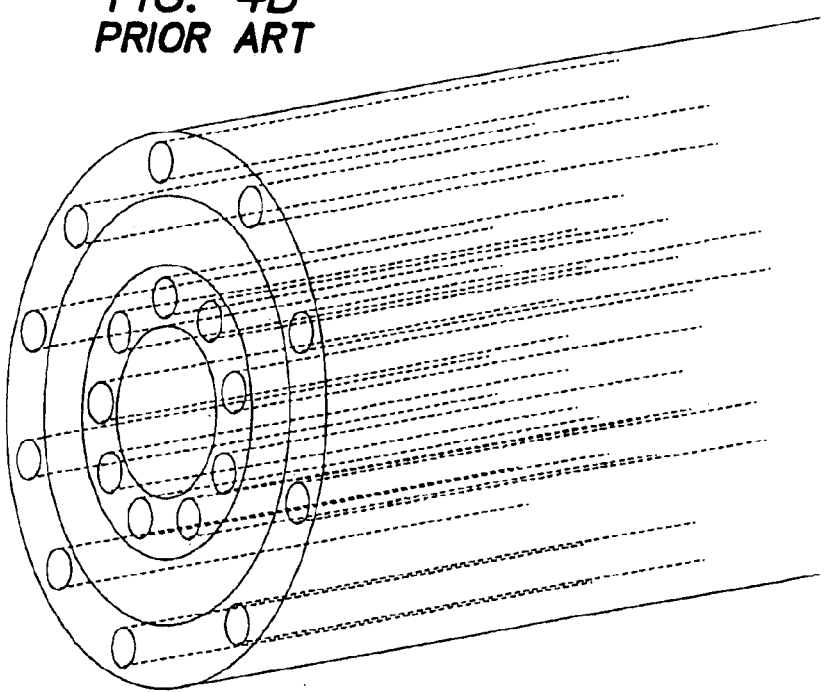

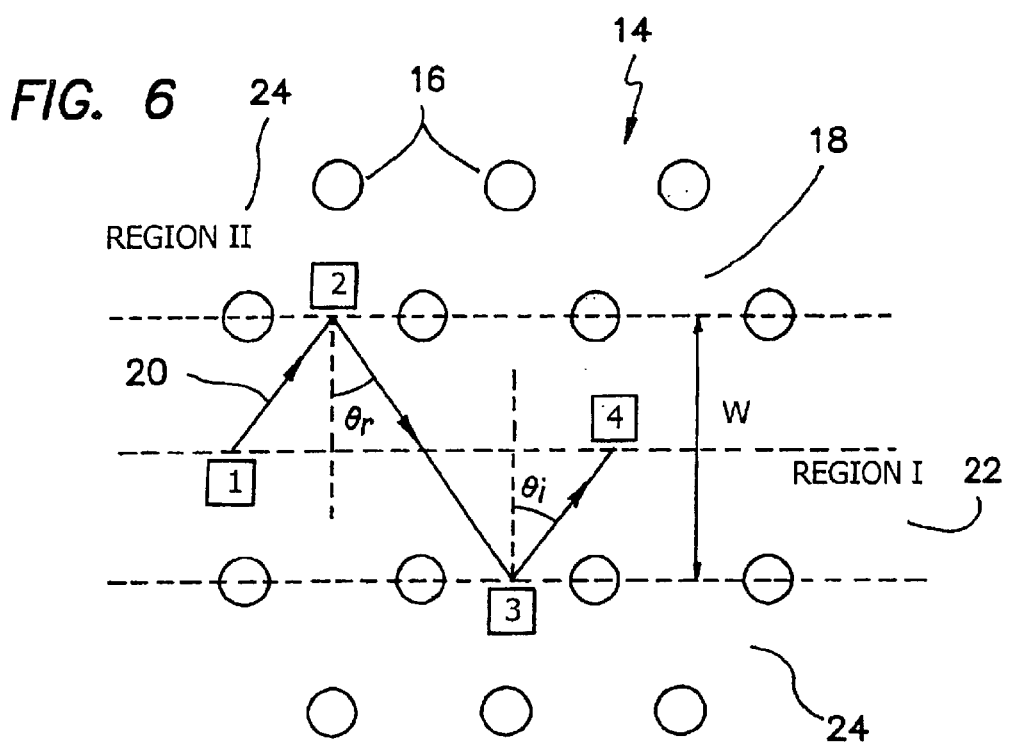
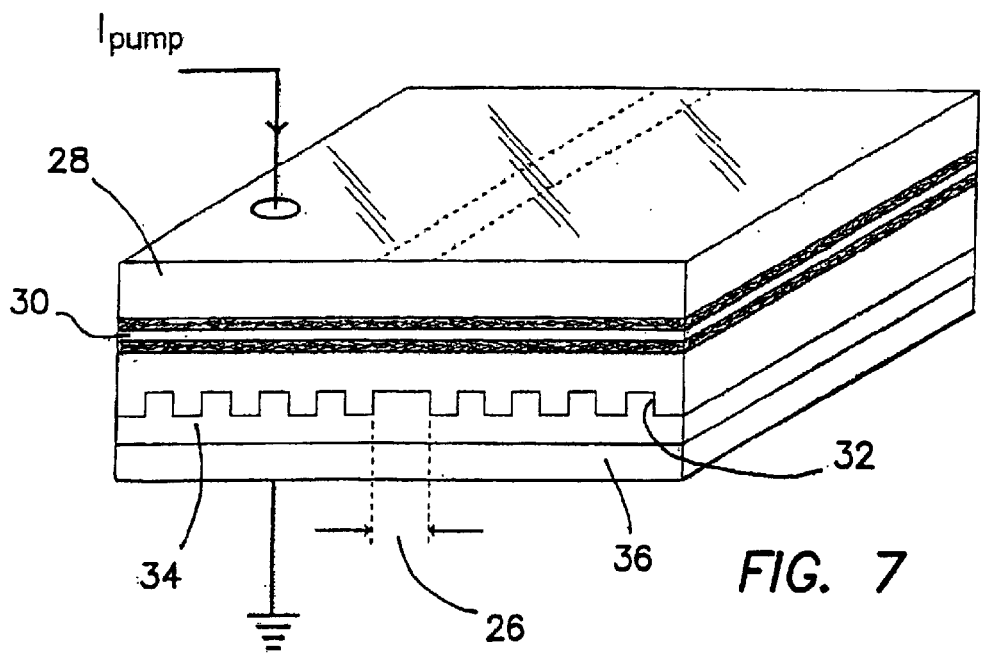

TRAVERSE BRAGG RESONANCE LASERS AND AMPLIFIERS AND METHOD OF OPERATING THE SAME

RELATED APPLICATIONS

The present application is related to U.S. Provisional Patent Application Ser. No. 60/442,490 filed on Jan. 24, 2003, which is incorporated herein by reference and to which priority is claimed pursuant to 35 USC 119.

BACKGROUND OF THE INVENTION

1. Field of the Invention

The invention relates to optical amplifiers and oscillators, and in particular to solid state lasers such as semiconductor diode lasers (SDL's) and fiber amplifiers in which the amplified light is confined to propagate in optical waveguides.

2. Description of the Prior Art

The amplifiers in issue here employ waveguides and depend for confinement not on total internal reflection from the index of refraction or discontinuity or gradient of the index as is the usual case, but rather on Bragg reflection from an artificially rendered periodic or quasi periodic medium. Such waveguides were first proposed and analyzed in 1976, and demonstrated in 1977 in planar geometries. An extension of this idea to fibers with a circular cylindrical geometry took place in 1978.

FIGS. 1, 2a, 2b, 3, 4a and 4b illustrate generically, a conventional dielectric waveguide, a fiber waveguide, a transverse Bragg waveguide and a Bragg confined fiber respectively. FIG. 1 a diagrammatic perspective view which shows a waveguide where $n_2 > n_1$ of the surrounding material and where the light bounces down the waveguide and is confined by the discontinuity in the index of refraction. FIG. 2a a diagrammatic perspective view of a planar realization of transverse Bragg waveguide layers. FIG. 2b a diagrammatic perspective view of an embodiment where the planar alternating periodicity is due to a corrugated wavy interface of an epitaxially grown layer. FIG. 3 is a diagrammatic perspective view of a conventional clad optic fiber where $n_2 > n_1$. FIG. 4a a diagrammatic perspective view of a cylindrical Bragg fiber where light is guided in the core and is Bragg reflected at the interface. FIG. 4b a diagrammatic perspective view of a waveguide where the index contrast between two adjacent layers is realized using longitudinal bores longitudinal bores which are empty or filled.

A recent paper by the inventor shows that periodic waveguides require that the width w of the periodic channel must be related to the unit cell dimension b. In the simplest case of a small index perturbation where $\Delta n \ll n$, $w = b/4$.

BRIEF SUMMARY OF THE INVENTION

The invention in the illustrated embodiment is directed to a semiconductor optical device comprising a transverse Bragg resonance waveguide comprised in turn of a waveguiding channel, and on at least two opposing sides of the channel two periodic index media; and a means for providing gain in the periodic index media.

The semiconductor optical device may be included within a laser, amplifier or oscillator.

In one embodiment the waveguiding channel is planar and is sandwiched on two opposing sides by the periodic index media. In another embodiment the waveguiding channel is cylindrical and is surrounded by the periodic index media. In one embodiment the means for providing gain in the periodic index media is electrical. In another embodiment the means for providing gain in the periodic index media is optical. The periodic index media comprises in one embodiment a periodic lattice of regions having an index of refraction distinct from the channel, such as an array of transverse holes defined in a planar semiconductor substrate in which the channel is also defined, or an array of longitudinal holes defined in a cylindrical semiconductor fiber in which the channel is also longitudinally defined.

The invention is also characterized as a method of operating a transverse Bragg waveguiding device as described above, while providing gain in the periodic index media while propagating the light wave.

Further the invention is defined as a method of providing an active transverse Bragg resonance waveguide comprising fabricating a planar waveguiding channel and sandwiching the planar waveguiding channel on two opposing sides by a periodic index media, and providing gain to the periodic index media, or fabricating a cylindrical waveguiding channel and surrounding the cylindrical waveguiding channel by a periodic index media, and providing gain to the periodic index media. The periodic index media can be electrically or optically pumped to provide gain.

In the illustrated embodiment the light wave is propagated at a detuned frequency given by $k_0 = (1+v)\pi/b$ where $k_0$ is the modal wave number of the propagated light, v is the frequency, and b is the transverse periodicity of the periodic index media.

The semiconductor optical device is operated in a mode which has a gain enhancement, $\eta$, due to an increase of a gain constant, $\beta_I$, of the propagating wave over the gain constant of a bulk dielectric and a substantial electric field content outside the channel leading to a larger modal cross-sectional area, and higher output power.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The invention can be better visualized by turning now to the following drawings wherein like elements are referenced by like numerals.

BRIEF DESCRIPTION OF THE DRAWINGS

FIG. 4a is a perspective diagrammatic view of a prior art cylindrical Bragg fiber.

FIG. 4b is a perspective diagrammatic view of a prior art modified cylindrical Bragg fiber.

FIG. 4b is a perspective diagrammatic view of a prior art modified cylindrical Bragg fiber.

FIG. 4b is a perspective diagrammatic view of a prior art modified cylindrical Bragg fiber.

FIG. 6 is a top plan diagrammatic view of a two dimensional Bragg waveguiding structure according to the invention.

FIG. 7 is a perspective diagrammatic view of a transverse Bragg reflecting amplifier according to the invention.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

FIGS. 1, 2a, 2b, 3, 4a and 4b are examples of passive waveguiding where all the materials involved are low optical loss and are ideally transparent. In contrast in the invention the optical confinement is based on "pumping", i.e., activating the periodic Bragg media so that it is capable of amplifying light. How this pumping is achieved can vary from one laser type to another and the preferred embodiments are discussed below.

Figure 1:
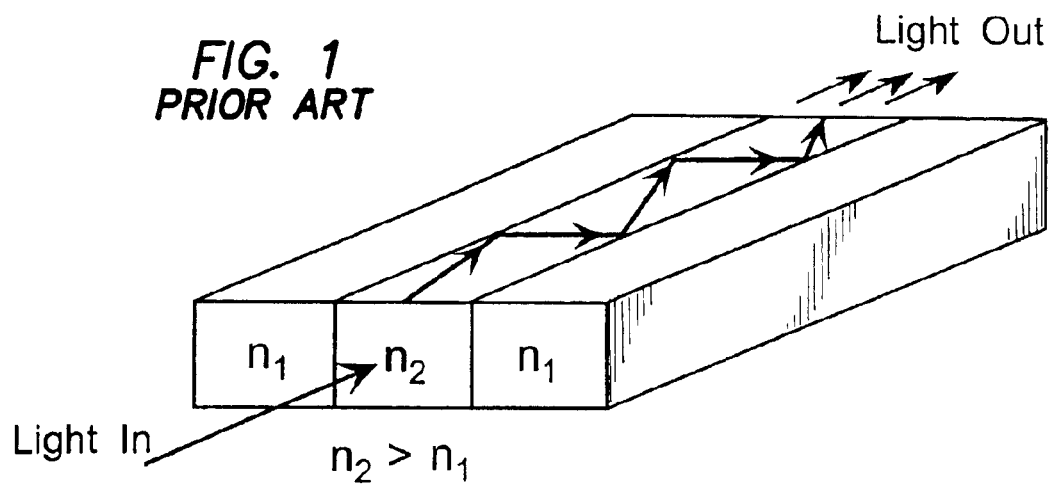
FIG. 1 is a perspective diagrammatic view of a prior art dielectric waveguide.
Figure 3:
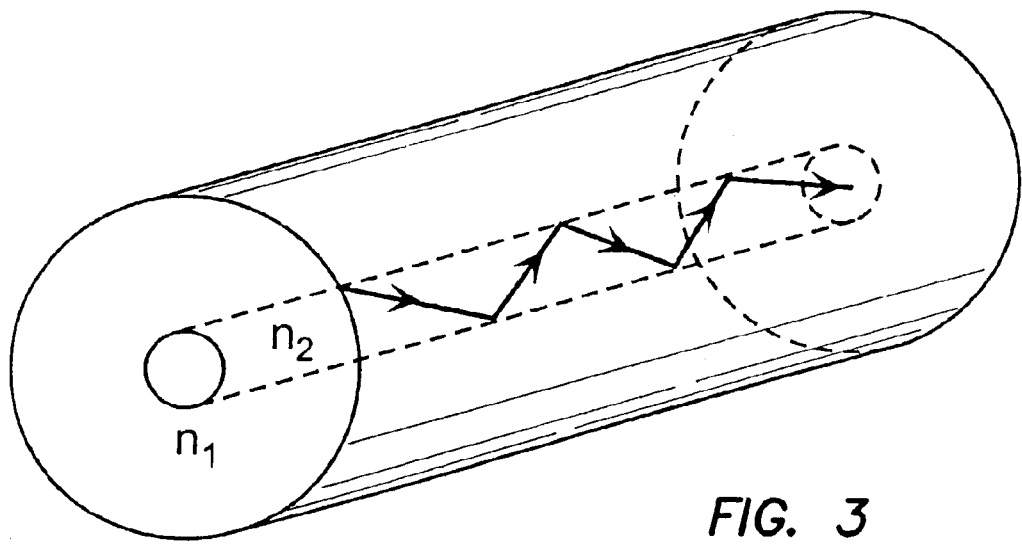
FIG. 3 is a perspective diagrammatic view of a prior art cylindrical, cladded, optical fiber.
Figure 2A:
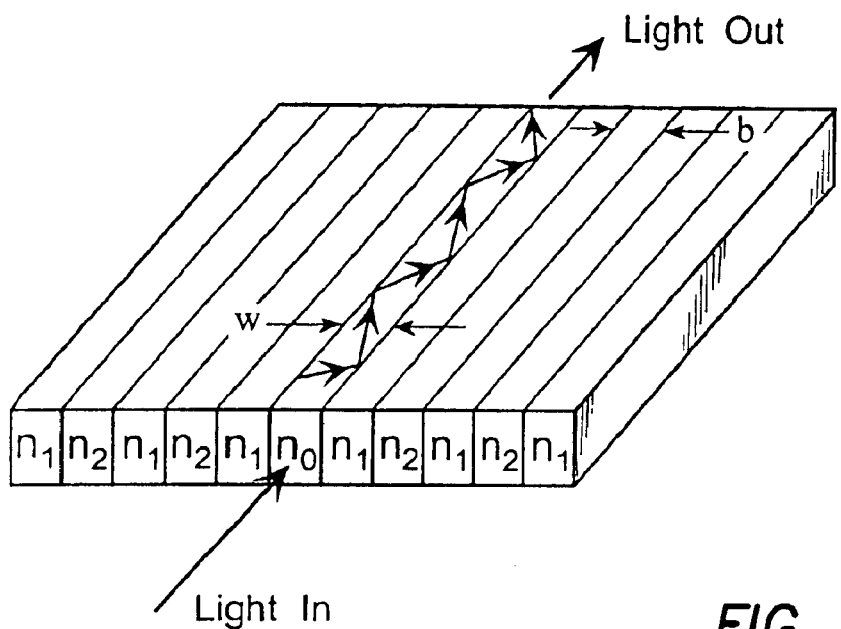
FIG. 2a is a perspective diagrammatic view of a prior art planar transverse Bragg waveguide.
Figure 2B:
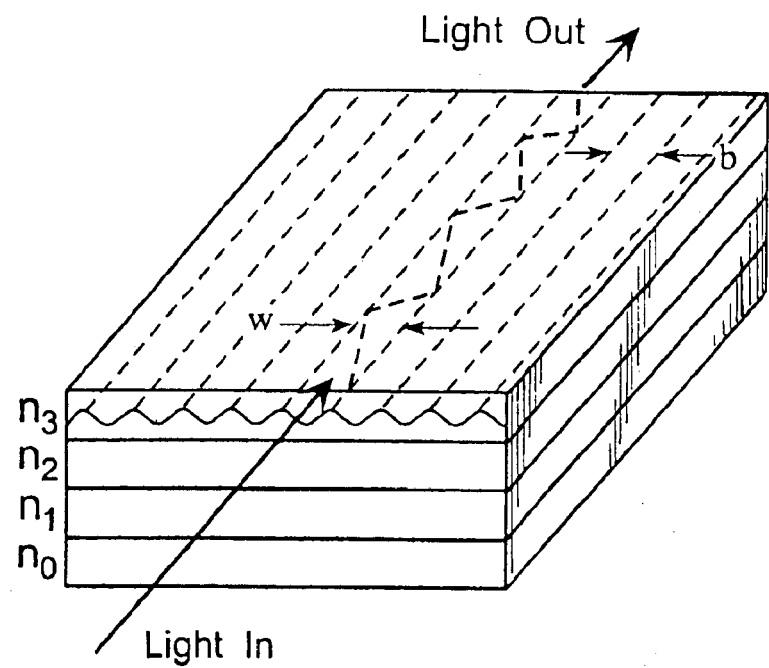
FIG. 2b is a perspective diagrammatic view of a prior art corrugated interface Bragg waveguide.
Figure 5A:
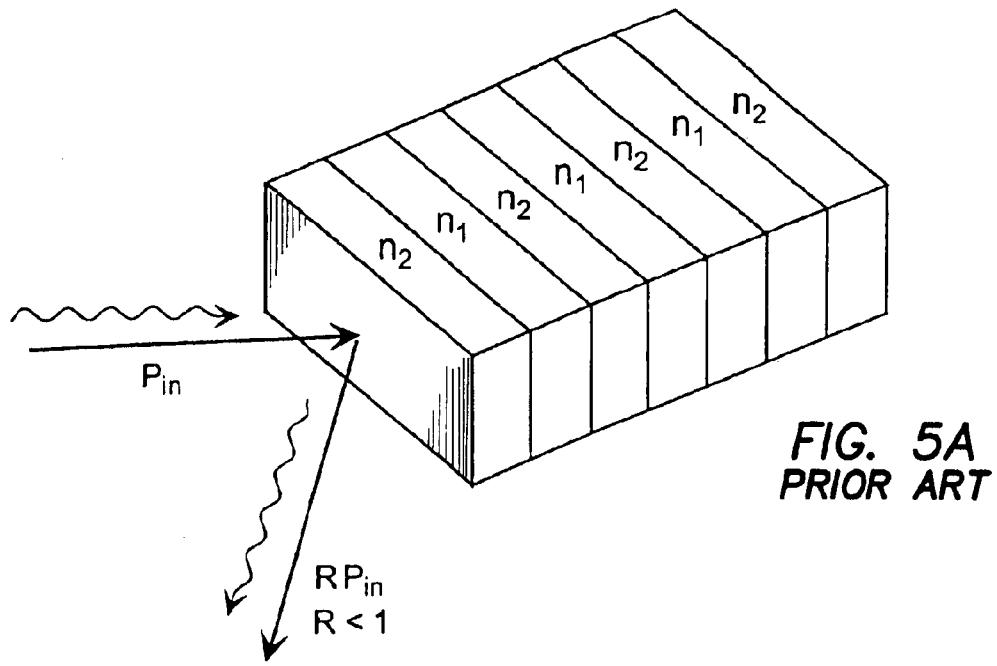
FIG. 5a is a perspective diagrammatic view of a prior art passive Bragg reflector.
Figure 5B:
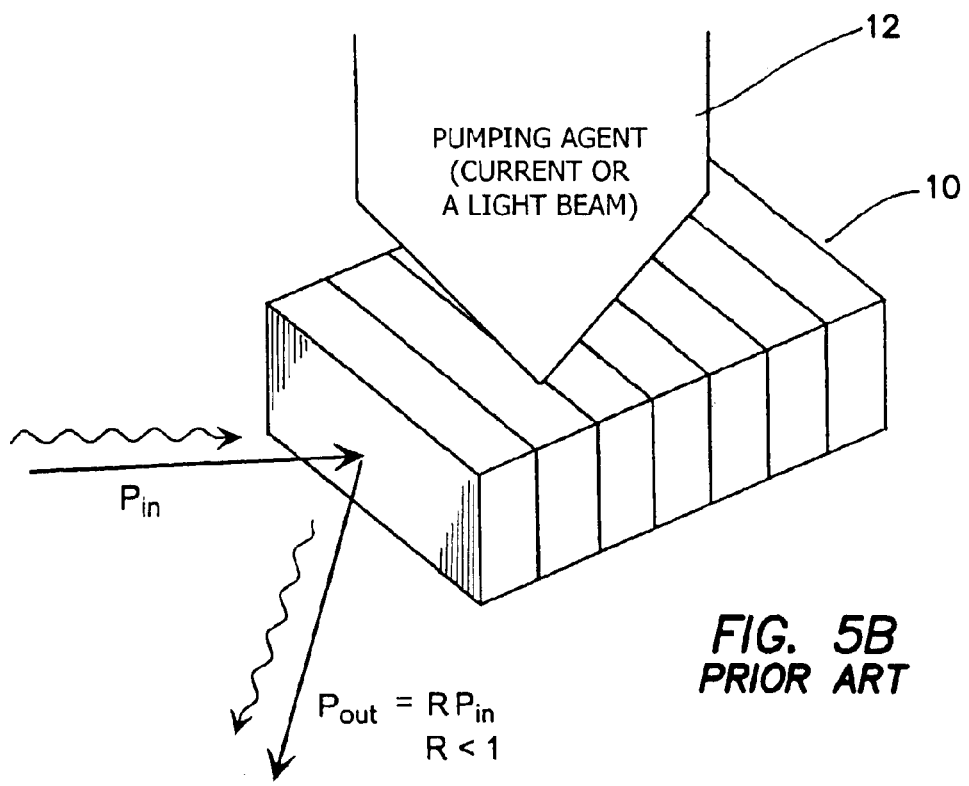
FIG. 5b is a perspective diagrammatic view of a prior art active Bragg reflector.

While a passive periodic medium acting as a Bragg reflector as shown in the perspective view of FIG. 5a can achieve reflectivities approaching, but never achieving, 100%, (i.e., with gain) periodic medium can achieve reflectivities R>1, i.e., the reflected light power exceeds that of the incident power. The pumping mechanism shown schematically in the perspective view of FIG. 5b is an electric current 12 in the case of a semiconducting medium or an optical beam 12 of the proper wavelength, usually shorter than that amplified by the medium 10, either of which is used to excite atoms of the periodic medium 10 so as to create an amplifying inverted atomic population.

In the top diagrammatic plan view of FIG. 6 we show another embodiment of a planar transverse Bragg waveguide 14 in which the periodicity is achieved by forming or drilling holes 16 into the two-dimensional guiding layer 18. A two dimensional waveguiding structure is provided which is comprised of a guiding channel of width W, a core, between two semi-infinite arrays of air holes 16 in a periodic pattern, e.g. a triangular lattice acting as a cladding. Shown in the core or region 22 of FIG. 6 are two in-plane k vectors of the plane waves that comprise the waveguide mode. The mode can be visualized as a wave, represented by the arrows 20, zigzagging down the channel of region 22 and Bragg reflected at the interface with region 24. If region 24 on both or one side is pumped, then upon each reflection the wave grows a bit and its intensity increases along the Z direction, which in FIG. 6 is the direction of wave propagation, i.e., we have an amplifier.

In the diagrammatic perspective view of FIG. 7, we show an embodiment using a current injected semiconductor laser material similar to that used in commercial semiconductor diode lasers. N type InP cladding 28 is formed on a multiple quantum well regions 30 disposed on a p-type InP substrate into which a plurality of longitudinal trenches 32 have been formed and filled by an adjacent InGaAs layer 34, which is then finished with a-type InP cladding layer 36. Pumping electrodes are provided on cladding layers 28 and 34. Here the transverse modulation is achieved by etching a channel 26 parallel to the Z axis of the core and "refilled" using a material with a different index, namely InGaAs. Parallel trenches 32 flanking guiding channel 26 define a periodic index variation in the transverse X direction and contribute to modal confinement.

The advantages of such an amplifier are manifold:

(1) The wave incident on the interface of the waveguide and the surrounding material is not reflected simply at the interface. It penetrates a considerable distance which may exceed the channel width W by a considerable factor (>1). It can thus "milk" a large volume of amplifying medium which results in gain per unit length, in the direction, far in excess of what is possible in conventional based amplifiers.

(2) Higher order modes are discouraged by the need to satisfy the Bragg condition ($k_{transverse}b=\pi$). Otherwise the reflectivity and gain diminish.

(3) There exist numerous ways of pumping the periodic medium, as shown by way of example in FIGS. 5b and 7. The basic structure uses an epitaxially grown semiconductor crystal. A p~n junction near the corrugated interface provides optical gain when current is made to flow across the junction.

In a similar fashion an optical fiber amplifier results if the periodic annular media are made active (amplifying). This can be done, for instance, by doping the glass $n_1$ and $n_2$ layers with Erbium and shining a pumping light at 1.48 $\mu$m or 0.98 $\mu$m in the manner used to pump conventional optical fiber amplifiers. Another method involves employing groups of holes parallel to the axis as shown in FIG. 4b. Each ring of holes acts effectively as one of the annular rings of FIG. 4b, for example, as one of the $n_1$ rings.

The physics underlying the above embodiments can now be described. What is disclosed is an optical amplifier which is formed by providing gain in the periodic "cladding" of a transverse Bragg resonance waveguide. Using the coupled-wave formalism, we calculate the mode profiles, the exponential gain constant and, for comparison, the gain enhancement over conventional semiconductor optical amplifiers. In contrast with coupled-mode theory in one-dimensional structures (e.g., the DFB laser), the exponential gain constant in the longitudinal direction is involved in both the longitudinal and transverse confinement, and has to be solved for self-consistency, together with the quantized guiding channel width.

The invention can be implemented as an optical laser, amplifier or oscillator. In the preferred embodiment the amplifier is comprised of a guiding channel 50 (or "core") which is sandwiched between two periodic-index media 52 (or "cladding"), or in a cylindrical geometry, surrounded by it. The periodic media 52 possess optical gain, and the core 50 may or may not. The basic concept behind this amplifier is the following: It is well known that one can form optical waveguides which depend on Bragg reflection from a periodic cladding, rather than on total internal reflection. It is also known that if the periodic medium possesses optical gain then an incident wave can be amplified upon reflection. These two ideas are combined here, and referring to FIG. 6, imagine a plane-like wave zigzagging inside a uniform guiding channel 22 which is flanked on each side by amplifying periodic media 24. Since the wave is amplified upon each reflection, we expect the wave to grow exponentially along Z. In conventional laser amplifiers, one usually solves for the electromagnetic modes of the passive confining structure, and "adds" the optical gain assuming that the presence of gain modifies the modes only negligibly. This is not the case when the confinement is due to Bragg reflection, since in this case the field distribution inside the periodic medium 24 changes drastically when gain is present. The amplification and confinement issues have to be addressed self-consistently. The theoretical issues which arise and some of the features of the transverse Bragg resonance (TBR) amplifiers are entirely novel.

Referring to FIG. 6, we seek a modal propagating solution to the Helmholtz equation (1)

$$\nabla^2 E(r,t) - \mu\epsilon(r)\frac{\partial^2 E(r,t)}{\partial t^2} = 0. \tag{1}$$

We allow $\epsilon(r)$ to be complex, $\epsilon(r)=\epsilon_R(X)+i\,\epsilon_I(X)$, and seek a solution with an $\exp[i(\omega t-\beta z)]$ dependence, where $\beta=\beta_R+i\beta_I$. Modal amplification obtains when $\beta_I>0$.

The wave equation, Eq. (1), now reads $$\frac{d^2 E}{dx^2} + (\omega^2\mu\epsilon_R - \beta_R^2)E + i(\omega^2\mu\epsilon_I - 2\beta_R\beta_I)E = 0, \tag{2}$$

where we have assumed that $|\beta_I|<<|\beta_R|$. In the periodic cladding, with unit cell (b×a×z), we can represent $$\epsilon_R(r) = \sum_{m,n}\epsilon_{Rmn}\exp(iK_{mn}\cdot r), \tag{3}$$

where $$K_{mn} = m\left(\frac{2\pi}{b}\right)\hat{x} + n\left(\frac{2\pi}{a}\right)\hat{z}.$$

The only term in the expansion capable of coupling, by phase-matched Bragg reflection, the two plane wave components of the field in the core region is the term m=1, n=o which can be written as $$\epsilon_R(x) = \epsilon_{R0} - 2\epsilon_1\cos\left(\frac{2\pi}{b}x\right), \tag{4}$$

where $$\epsilon_1 \equiv \epsilon_{01} = \frac{1}{ab}\int\int_{u.c.}\epsilon(r)\exp\left(-i\frac{2\pi}{b}x\right)dxdz. \tag{5}$$

A substitution of Eq. (4) renders Eq. (2) into the form, $$\frac{d^2 E}{dx^2} + k_0^2 E - 2\omega^2\mu\epsilon_1\cos\left(\frac{2\pi}{b}x\right)E + i(\omega^2\mu\epsilon_I - 2\beta_R\beta_I)E = 0. \tag{6}$$

where $k_0^2 \equiv \omega^2\mu\epsilon_{R0}-\beta_R^2$.

We look for solutions in the combined core and cladding regions of the general form, $$E(z,\chi,t)=[A(\chi)e^{-ik_0\chi}+B(\chi)e^{ik_0\chi}]e^{i(\omega t-\beta z)}\equiv E_{195}(\chi)e^{i(\omega t-\beta z)}, \tag{7}$$

which is motivated by the fact that when $\epsilon_1=0$ and $\epsilon_I=0$ (which implies that $\beta_1=0$), A and B are independent of x and also of each other. A substitution of Eq. (7) into Eq. (6) and in the vicinity of the Bragg condition $k_o\approx\pi/b$ ($k_o\approx 2\pi/b$ for the triangular lattice) results in the familiar coupled wave equations, $$\frac{dA}{dx} = \gamma A + \kappa^* B e^{i2(k_0-\pi/b)x} \tag{8}$$

$$\frac{dB}{dx} = -\gamma B + \kappa A e^{-i2(k_0-\pi/b)x}$$

on the interval $0\leq x\leq L$, the cladding region. We have defined $$\gamma = \frac{\omega^2\mu\epsilon_I^{(clad)}}{2k_0} - \frac{\beta_R\beta_I}{k_0}, \kappa = -\frac{i\omega^2\mu\epsilon_I}{2k_0}. \tag{9}$$

We solve Eq. (8) subject to the condition that at the outer edge of the cladding, there is no reflected wave, i.e., B(L)=O. The result is a superposition of Bloch waves, $$E_\pm^{(clad)}(x) = F\left\{e^{-i\pi x/b}\frac{(\gamma-i\Delta k)\sinh[S(L-x)] - S\cosh[S(L-x)]}{(\gamma-i\Delta k)\sinh[SL] - S\cosh[SL]} + e^{+i\pi x/b}\frac{\kappa\sinh[S(L-x)]}{(\gamma-i\Delta k)\sinh[SL] - S\cosh[SL]}\right\} \tag{10}$$

where $$S \equiv \sqrt{|\kappa|^2 + (\gamma-i\Delta k)^2}, \quad \Delta k \equiv k_0 - \frac{\pi}{b}, \tag{11}$$

and F is a scale factor which will be needed in matching the fields at x=0. The "exact" Bloch solution Eq. (10) is a key ingredient in our modal solution.

In the uniform core region $(-W\leq x\leq 0)$, the field is governed by the Helmholtz equation, Eq. (6), with $\epsilon_1=0$. We assume that the real part of the average dielectric constant $\epsilon_R$ is the same in both the core and cladding regions, and will present results for two cases, (a) gain in the cladding as well as the core, $\epsilon_I^{core}=\epsilon_I^{clad}$, and (b) gain in the cladding only, $\epsilon_I^{core}=0$. We write the solution as $$E_\perp^{(core)}(\chi) = e^{-ik'(\chi+W/2)}\pm e^{ik'(\chi+W/2)} \tag{12}$$

where $$k' \equiv k_0\left[1 + \frac{i}{2k_0^2}(\omega^2\mu\epsilon_1^{(core)} - 2\beta_R\beta_I)\right]. \tag{13}$$

The signs + and − in Eq. (12) go with modes of even or odd symmetry, respectively.

In Eqs. (10) and (12), we have the field solutions for the cladding and the core, respectively. These two solutions are stitched together at the interface by requiring that the +x-traveling component in the core is the same as its counterpart in the cladding at x=0. The same condition is applied to the waves traveling in the −x direction. This ensures the continuity of the total fields at x=0, and to a very high degree (consistent with the basic nature of the perturbation involved in a coupled-wave approach) the continuity of the total field derivative. It is also the condition used to obtain the reflectance of Bragg gratings. These two conditions can be expressed, using Eqs. (10) and (12), as $$\exp(-ik'W/2) = F, \quad (14)$$

$$\exp(ik'W/2) = \frac{\pm \kappa F}{(\gamma - i\Delta k) - S\coth(SL)}.$$

It follows that $$e^{ik'W} = \frac{\pm \kappa}{(\gamma - i\Delta k) - S\coth(SL)} \quad (15)$$

where $$S \equiv \sqrt{|\kappa|^2 + (\gamma - i\Delta k)^2}, \quad \gamma = \frac{\omega^2 \mu \epsilon_1^{(clad)}}{2k_0} - \frac{\beta_R \beta_I}{k_0},$$

$$\kappa = -\frac{i\omega^2 \mu \epsilon_1}{2k_0}, \quad k_0^2 \equiv \omega^2 \mu \epsilon_{R0} - \beta_R^2,$$

$$k' \equiv k_0 \left[ 1 + \frac{i}{2k_0^2} (\omega^2 \mu \epsilon_1^{(core)} - 2\beta_R \beta_I) \right].$$

Eq. (15) is the main result of this analysis. It can be written in terms of magnitude and phase as $$\exp\left[ \left( \frac{\beta_R \beta_I}{k_0} - \frac{\omega^2 \mu \epsilon_1^{(core)}}{2k_0} \right) W \right] = \left| \frac{\kappa}{(\gamma - i\Delta k) - S\coth(SL)} \right|, \quad (16)$$

$$k_0 W = \text{Phase}\left[ \frac{\pm \kappa}{(\gamma - i\Delta k) - S\coth(SL)} \right]. \quad (17)$$

Eq. (17) is used to determine the core width. In the case of a passive triangular lattice and $\Delta k=0$, Phase($\kappa$)=$-\pi/2$ and since $k_0=2 \pi/b$, the allowed values of W are $b/4, 5b/4, \ldots$ for even symmetry modes and $3b/4, 7b/4, \ldots$ for odd symmetry modes. The latter require the use of the (−) sign in Eq. (12). Below we will concentrate on the even-symmetric lowest-order solution.

The full transverse profile is given by $$E_\perp(x) = \begin{cases} E_1^{(clad)}(x), & 0 < x \le L \\ E^{(core)}(x), & -W \le x \le 0 \\ E_1^{(clad)}(-x + W), & -(L+W) \le x < -W \end{cases} \quad (18)$$

The modal equations, Eqs. (16) and (17), both involve the gain constant $\beta_I$ and the core width W in a complicated way, which requires a self-consistent numeric solution. We analyze two structures: the first with cladding width L=5 μm and the second with cladding width L=15 μm.

Figure 8A:
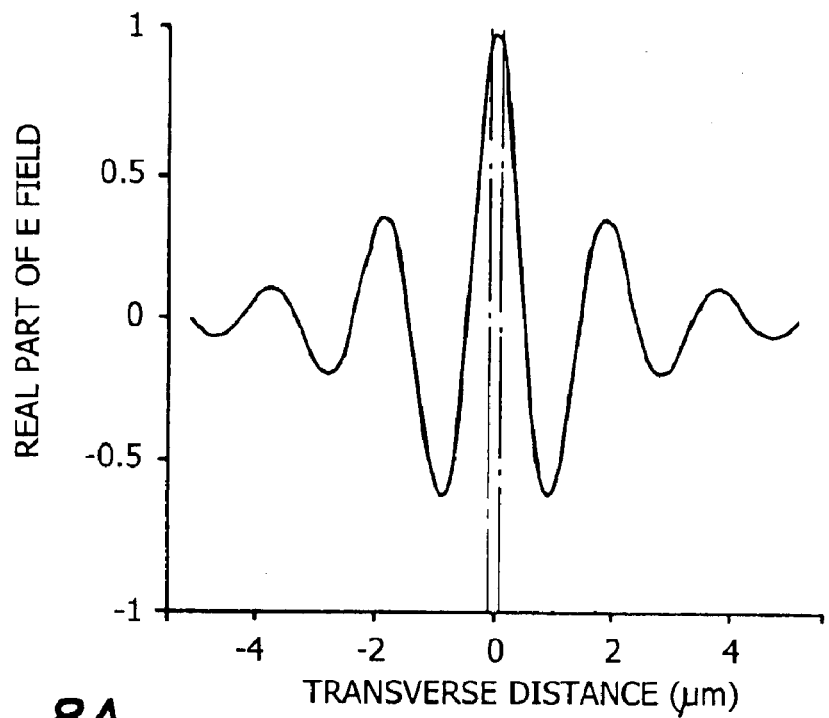
FIG. 8a is a graph of the real part of the electric field, E, in the core of a waveguiding structure without gain as a function of transverse distance.
Figure 8B:
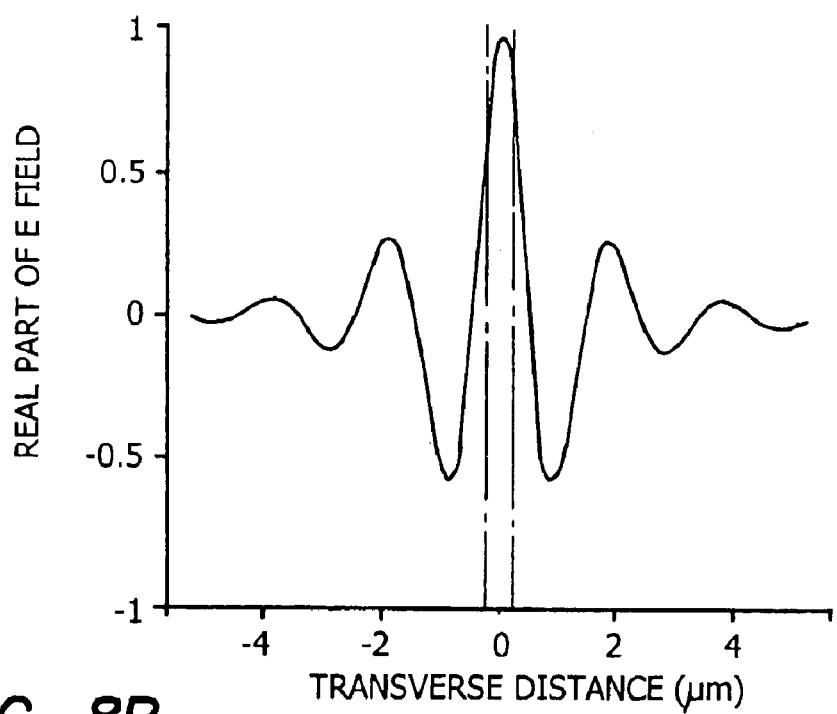
FIG. 8b is a graph of the real part of the electric field, E, in the core of a waveguiding structure with gain as a function of transverse distance.

For L=5 μm, FIG. 8a shows the transverse mode profiles when $\epsilon_1^{core}=0$ and FIG. 8b shows the transverse mode profiles when $\epsilon_1^{core}=\epsilon_1^{clad}$. The Bloch nature of the field in the cladding is clearly evident. We use the following numerical values: wavelength $\lambda_o=1.55$ μm; real part of dielectric coefficient $\epsilon_R=12.5$ $\epsilon_0$; imaginary part of dielectric coefficient $\epsilon_I=10^{-3}$ $\epsilon_R$; strength of grating $\epsilon_1=\epsilon_R/40$; transverse periodicity of cladding b=1.25×1.55 μm. The calculated numerical values of the gain and core width etc. in all four cases are listed in

TABLE 1

| L | cladding width (each section) | 5 μm | 5 μm | 15 μm | 15 μm |
|---|---|---|---|---|---|
| $\epsilon_1^{(core)}$ | core gain | yes | no | yes | no |

TABLE 1-continued

| W | core width | 484 nm | 265 nm | 126 nm | 55 nm |
|---|---|---|---|---|---|
| $\beta_I$ | gain constant | 72.7 cm$^{-1}$ | 58.7 cm$^{-1}$ | 74.4 cm$^{-1}$ | 73.3 cm$^{-1}$ |
| v | detuning | 0 | 0.124 | 0.183 | 0.199 |
| η | gain enhancement | 3.58 | 2.89 | 3.67 | 3.61 |
| | power leakage | −34.4 dB | −26.8 dB | −47.2 dB | −31.2 dB |

"Detuning" v is defined by the relationship $k_0=(1+v) \pi/b$, and in most cases, the optimum operating point is not exactly on-resonance, when v=0.

"Power leakage" refers to the field intensity at the outer edge of the cladding; although the field component propagating towards to the core is taken to be zero by our boundary condition B(L)=0 in solving Eq. (8), the outward-propagating component A(L) is typically not zero. As Table 1 shows, however, it can be made small by increasing the width of the cladding region. For wider cladding (greater L), the envelope has to decay more slowly with x to satisfy B(L)=0; the core width W is forced to be smaller so that the field does not decay as much away from the center peak.

"Gain enhancement" η refers to the increase of $\beta_I$ in this structure over the gain constant of bulk dielectric. It is an enhancement of the exponential factor, and the typical increase of 300% or more is a substantial advantage of these structures over conventional uniform-dielectric waveguides. This enhancement reflects the fact that in a Transverse Bragg Resonance laser, the wave "spends" much more time in the cladding than in the core. Greater gain may be achieved, or shorter devices will suffice for given gain. Also, the substantial field content outside the narrow core region leads to a larger modal cross-sectional area, and consequently higher output power, compared to conventional semiconductor laser structures. The field extends further into the cladding in the absence of core gain, $\epsilon^{core}=0$, indicating a trade-off between overall power output and the longitudinal gain enhancement factor η.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

I claim:

1. A semiconductor optical device comprising:
   a transverse Bragg resonance wave guide comprised in turn of a wave guiding channel, the wave guiding channel transmits optical energy and guides the direction of the propagating wave, and on at least two opposing sides of the channel two periodic index media; and
   means for providing gain in the periodic index media by pumping the transverse Bragg resonance wave guide, wherein upon each reflection the wave intensity increases.

2. The semiconductor optical device of claim 1 where the device is included within a laser.

3. The semiconductor optical device of claim 1 where the device is included within an amplifier.

4. The semiconductor optical device of claim 1 where the device is included within an oscillator.

5. The semiconductor optical device of claim 1 where the wave guiding channel is planar and is sandwiched on two opposing sides by the periodic index media.

6. The semiconductor optical device of claim 1 where the wave guiding channel is cylindrical and is surrounded by the periodic index media.

7. The semiconductor optical device of claim 1 where the means for providing gain in the periodic index media is electrical.

8. The semiconductor optical device of claim 1 where the means for providing gain in the periodic index media is optical.

9. The semiconductor optical device of claim 1 where the periodic index media comprises a periodic lattice of regions having an index of refraction distinct from the channel.

10. The semiconductor optical device of claim 9 where the periodic lattice comprises an array of transverse holes defined in a planar semiconductor substrate in which the channel is also defined.

11. The semiconductor optical device of claim 9 where the periodic lattice comprises an array of longitudinal holes defined in a cylindrical semiconductor fiber in which the channel is also longitudinally defined.

12. A method of operating a semiconductor optical device comprising:
    propagating a light wave within a transverse Bragg resonance wave guide comprised of a wave guiding channel, the wave guiding channel transmits and guides optical energy in a controlled direction, and on at least two opposing sides of the channel two periodic index media; and
    providing gain in the periodic index media by pumping the transverse Bragg resonance waveguide while propagating the light wave.

13. The method of claim 12 where propagating a light wave is performed within a laser.

14. The method of claim 12 where propagating a light wave is performed within an amplifier.

15. The method of claim 12 where propagating a light wave is performed within an oscillator.

16. The method of claim 12 where providing gain in the periodic index media comprises electrically pumping the periodic index media.

17. The method of claim 12 where providing gain in the periodic index media comprises optically pumping the periodic index media.

18. The method of claim 12 where propagating a light wave comprises propagating a light wave at a detuned frequency given by $k_0=(1+v)\pi/b$ where $k_0$ is the modal wave number of the propagated light, $v$ is the frequency, and $b$ is the transverse periodicity of the periodic index media.

19. The method of claim 12 where the semiconductor optical device is operated in a mode which has a gain enhancement, $\eta$, due to an increase of a gain constant, $\beta_I$, of the propagating wave over the gain constant of a bulk dielectric and a substantial electric field content outside the channel leading to a larger modal cross-sectional area, and higher output power.

20. A method of providing an active transverse Bragg resonance wave guide comprising fabricating a planar wave guiding channel and sandwiching the planar wave guiding channel on two opposing sides by a periodic index media, and providing gain to the periodic index media, the wave guiding channel transmitting and guiding optical energy in a controlled direction.

21. A method of providing an active transverse Bragg resonance wave guide comprising fabricating a cylindrical wave guiding channel and surrounding the cylindrical wave guiding channel by a periodic index media, and providing gain to the periodic index media by pumping the traverse Bragg resonance wave guide.

* * * * *

UNITED STATES PATENT AND TRADEMARK OFFICE
CERTIFICATE OF CORRECTION

PATENT NO. : 6,934,425 B2
DATED : August 23, 2005
INVENTOR(S) : Amnon Yariv

It is certified that error appears in the above-identified patent and that said Letters Patent is hereby corrected as shown below:

Column 1,
Line 4, should include the following statement:
-- The invention described herein was made in the performance of work by Federal Support funding by DARPA Grant No. MDA972-00-1-0022 and ONR - Space and Naval Warfare Systems Center Grant No. N00014-00-1-0104 --.

Signed and Sealed this

Tenth Day of January, 2006

JON W. DUDAS
*Director of the United States Patent and Trademark Office*